(12) United States Patent
Rigault et al.

(10) Patent No.: US 11,211,770 B2
(45) Date of Patent: Dec. 28, 2021

(54) CONTROL CIRCUIT FOR A LASER DIODE

(71) Applicant: STMicroelectronics (Grenoble 2) SAS, Grenoble (FR)

(72) Inventors: Samuel Rigault, Grenoble (FR); Nicolas Moeneclaey, Vourey (FR)

(73) Assignee: STMICROELECTRONICS (GRENOBLE 2) SAS, Grenoble (FR)

(*) Notice: Subject to any disclaimer, the term of this patent is extended or adjusted under 35 U.S.C. 154(b) by 146 days.

(21) Appl. No.: 16/577,103

(22) Filed: Sep. 20, 2019

(65) Prior Publication Data
US 2020/0106239 A1   Apr. 2, 2020

(30) Foreign Application Priority Data

Sep. 28, 2018   (FR) ...................................... 1859035

(51) Int. Cl.
*H01S 5/042* (2006.01)
*H01S 5/026* (2006.01)
*H01S 5/06* (2006.01)

(52) U.S. Cl.
CPC ............ *H01S 5/0428* (2013.01); *H01S 5/026* (2013.01); *H01S 5/042* (2013.01); *H01S 5/0607* (2013.01)

(58) Field of Classification Search
CPC ........ H01S 5/0428; H01S 5/042; H01S 5/026; H01S 5/0607
See application file for complete search history.

(56) References Cited

U.S. PATENT DOCUMENTS

| 2002/0171467 | A1 | 11/2002 | Worley, Sr. et al. |
| 2003/0156439 | A1 | 8/2003 | Ohmichi et al. |
| 2006/0285564 | A1* | 12/2006 | Kyogoku ............ H01S 5/06832 372/38.07 |
| 2008/0043792 | A1 | 2/2008 | Bozso et al. |
| 2017/0070029 | A1* | 3/2017 | Moeneclaey .......... H05B 45/10 |
| 2017/0264076 | A1* | 9/2017 | Moyer .................. H01S 5/0428 |

* cited by examiner

*Primary Examiner* — Michael Carter
(74) *Attorney, Agent, or Firm* — Slater Matsil, LLP

(57) ABSTRACT

A circuit includes a laser diode and a switched-capacitance charge pump coupled to control the laser diode. The charge pump can include a capacitor and a switching circuit that is capable of triggering a charge and discharge of the capacitor. The switching circuit can include a switch and an inverting circuit.

18 Claims, 3 Drawing Sheets

CONTROL CIRCUIT FOR A LASER DIODE

CROSS-REFERENCE TO RELATED APPLICATIONS

This application claims priority to French Patent Application No. 1859035, filed on Sep. 28, 2018, which application is hereby incorporated herein by reference.

TECHNICAL FIELD

The present disclosure generally concerns electronic circuits and, in particular, to a control circuit for a laser diode.

BACKGROUND

A laser diode is an optoelectronic component emitting monochromatic light. Laser diodes are for example used to transport signals containing information over long distances.

To operate a laser diode, it is necessary to send regular current pulses thereto. For this purpose, a laser diode generally comes along with a control circuit supplying such pulses.

It would be desirable to at least partly improve certain aspects of known laser diode control circuits.

SUMMARY

An embodiment provides a circuit for controlling a laser diode comprising a switched-capacitance charge pump.

According to an embodiment, the charge pump is capable of emitting current pulses at a frequency in the range from 10 to 800 MHz.

According to an embodiment, the charge pump comprises at least one capacitor.

According to an embodiment, the at least one capacitor has a capacitance in the range from 10 to 500 pF.

According to an embodiment, the charge pump further comprises a switching circuit capable of triggering the charge and the discharge of the capacitor.

According to an embodiment, the switching circuit comprises a first switch coupling a first electrode of the capacitor to a terminal receiving a power supply potential.

According to an embodiment, the switching circuit further comprises an inverting circuit comprising an output terminal coupled to a second electrode of the capacitor.

According to an embodiment, the switching circuit is controlled by a pulse train.

According to an embodiment, the pulses have a duty cycle in the range from 5 to 40%.

According to an embodiment, the switching circuit further comprises a second switch for balancing the charges of the laser diode.

According to an embodiment, the second switch has a first terminal coupled to the cathode of the laser diode, and comprises a second terminal receiving the power supply potential.

According to an embodiment, the second switch is an N-channel MOS transistor.

According to an embodiment, the second switch is controlled by the pulse train.

According to an embodiment, the second switch is a P channel MOS transistor.

According to an embodiment, the second switch is controlled by the inverse of the pulse train.

The foregoing and other features and advantages will be discussed in detail in the following non-limiting description of specific embodiments in connection with the accompanying drawings.

DETAILED DESCRIPTION OF ILLUSTRATIVE EMBODIMENTS

Figure 1:
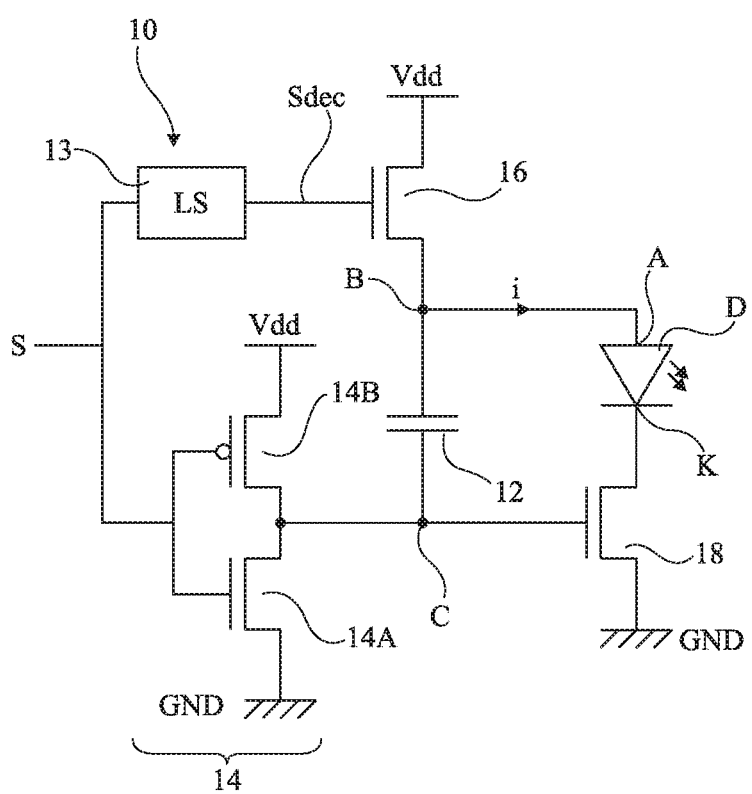
FIG. 1 shows an embodiment of a laser diode control circuit.

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed.

Throughout the present disclosure, the term "connected" is used to designate a direct electrical connection between circuit elements with no intermediate elements other than conductors, whereas the term "coupled" is used to designate an electrical connection between circuit elements that may be direct, or may be via one or more intermediate elements.

The terms "about", "substantially", and "approximately" are used herein to designate a tolerance of plus or minus 10%, preferably of plus or minus 5%, of the value in question.

FIG. 1 shows an embodiment of a circuit 10 for controlling a laser diode D. Laser diode D comprises an anode A and a cathode K.

Control circuit 10 is a circuit of switched capacitance charge pump type. Thus, circuit 10 comprises: a capacitor 12, a level shifter circuit (LS) 13, an inverting circuit 14, a switch 16, and a switch 18.

Capacitor 12 comprises a first electrode coupled, for example, connected, to a node B, and a second electrode coupled, for example, connected, to a node C. Anode A of laser diode D is coupled, preferably connected, to node B. Capacitor 12 has a capacitance for example in the range from 10 to 800 pF, for example, in the order of a few hundreds of pF. As a variation, capacitor 12 may be replaced with a plurality of capacitors in parallel.

Level shifter circuit 13 is a circuit outputting a signal Sdec shifted with respect to a signal S. Signal S is a signal carrying a pulse train varying between a reference potential GND, for example, the ground, and a positive power supply potential Vdd. The pulses have a duty cycle in the range from 5 to 40% and have a frequency in the range from 10 to 800 MHz. Signal Sdec varies between a low state equal to power supply potential Vdd and a high state at least equal to twice 2*Vdd of power supply potential Vdd.

Inverting circuit 14 comprises two switches 14A and 14B, for example, MOS transistors. Switch 14A is for example an N-type MOS transistor and switch 14B is for example a P-type MOS transistor. Switches 14A and 14B are coupled, for example, connected, in series. More specifically:

the source of switch 14A is coupled, preferably connected, to a terminal receiving reference potential GND, preferably the ground;

the drain of switch 14A is coupled, preferably connected, to node C;

the source of switch 14B is coupled, preferably connected, to a terminal receiving power supply potential Vdd; and the drain of switch 14B is coupled, preferably connected, to node C.

Switches 14A and 14B are controlled by signal S.

Switch 16 is for example an N-channel MOS transistor. The source of switch 16 is coupled, for example, connected, to node B. The drain of switch 16 is coupled, for example, connected, to the terminal receiving power supply potential Vdd. Switch 16 is controlled by signal Sdec.

Switch 18 is for example, an N-channel MOS transistor. The source of transistor 18 is coupled, for example, connected, to a terminal receiving reference potential GND. The drain of switch 18 is coupled, for example, connected, to cathode K of laser diode D. The gate of switch 18 is coupled, for example, connected, to node C. Node C being coupled to the output of inverter 14, switch 18 is controlled by the inverse of signal S.

Circuit 13, inverter 14, and switches 16 and 18 form a switching circuit of control circuit 10.

The operation of the control circuit comprises two phases. During a first phase, capacitor 12 charges, and during a second phase, capacitor 12 discharges into laser diode D. The two phases periodically alternate at the frequency of signals S and Sdec.

Capacitor 12 charges when signals S and Sdec are in a high state, that is, when signal S is equal to power supply potential Vdd and when signal Sdec is equal to twice power supply potential Vdd. The capacitance of capacitor 12 is adapted so that its charge time is shorter than the duration of a pulse of the pulse train of signals S and Sdec. In such a configuration:

switch 16 is on, and thus the potential at node B is equal to power supply potential Vdd;

switch 14A is on and switch 14B is off. Thus, node C receives reference potential GND; and switch 18 receives, on its gate, reference potential GND and is thus off.

Capacitor 12 discharges when signals S and Sdec are in a low state, that is, when signal S is equal to reference potential GND and when signal Sdec is equal to power supply potential Vdd. In such a configuration:

switch 16 is off;

switch 14A is off and switch 14B is on. Thus, node C receives power supply potential Vdd; and switch 18 is on.

The potential at anode A of laser diode D is then equal to twice (2*Vdd) power supply potential Vdd.

An advantage of this embodiment is that it enables to send current pulses to anode A of laser diode D regularly, and more particularly at frequencies in the range from 10 to 800 MHz.

Figure 2:
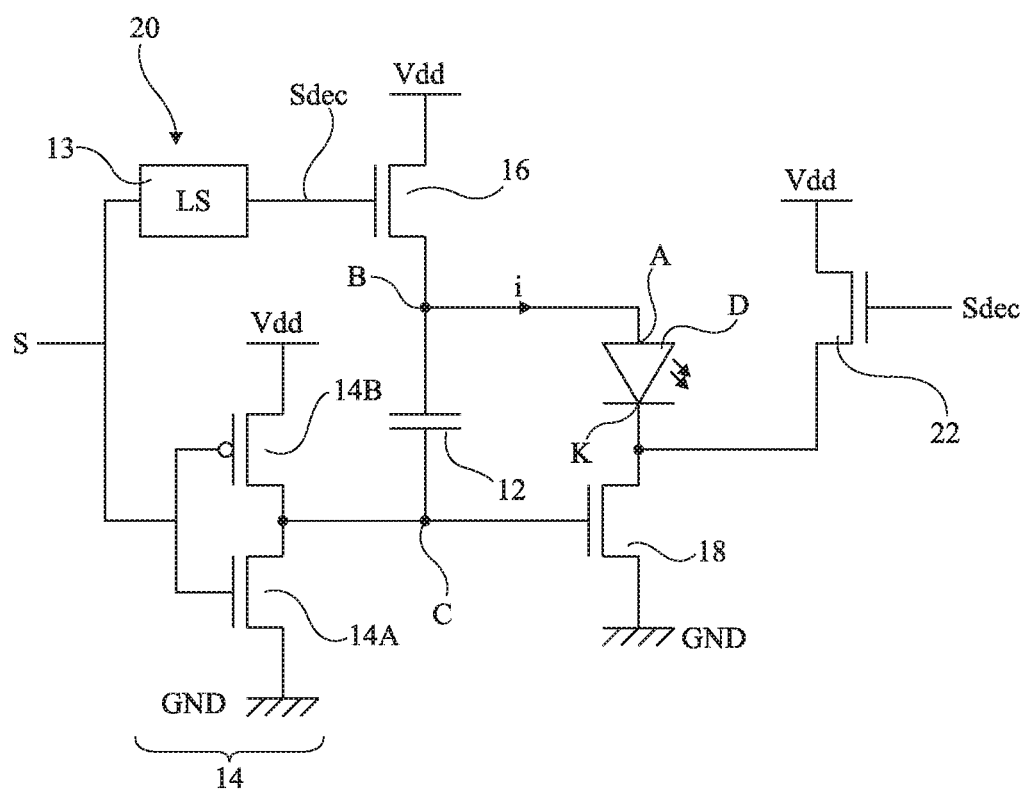
FIG. 2 shows another embodiment of a laser diode control circuit.

FIG. 2 shows an embodiment of a circuit 20 for controlling laser diode D. Control circuit 20 comprises the same elements as the control circuit 10 described in relation with FIG. 1, which elements will not be described again.

Control circuit 20 comprises, in addition to the components described in relation with FIG. 1, a charge balancing switch 22.

Switch 22 is for example an N-type MOS transistor. The source of switch 22 is coupled, preferably connected, to cathode K of laser diode D. The drain of switch 22 is coupled, preferably connected, to a terminal receiving power supply potential Vdd. Switch 22 is controlled by signal Sdec.

Control circuit 20 operates as follows.

During a charge phase of capacitor 12, switch 22 is on. Thus, anode A and cathode K of laser diode D receive power supply potential Vdd.

The addition of switch 22 has no influence on the discharge phase of capacitor 12, since it is off in this case.

An advantage of this embodiment is that it enables to balance the charges present in laser diode D during the charge of capacitor 12. More particularly, this enables to fully discharge laser diode D. Indeed, without switch 22, in certain cases, laser diode D risks not fully discharging. Fully discharging laser diode D further results in cutting off the optical emission of laser diode D more rapidly.

Another advantage of this embodiment is that the addition of an additional switch may enable to attenuate spurious oscillations caused by the inductance of the conductors coupling capacitor 12 and laser diode D. Indeed, switch 22 increases the resistivity of the control circuit, which attenuates spurious oscillations.

Figure 3:
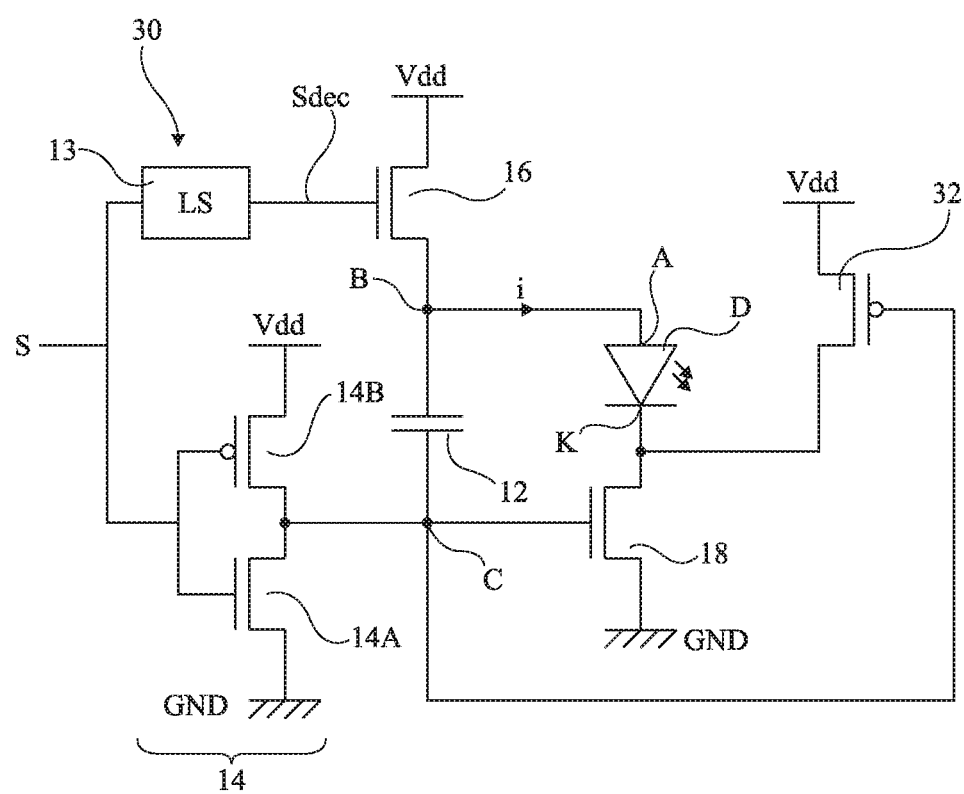
FIG. 3 shows an alternative embodiment of the circuit of FIG. 2.

FIG. 3 shows an embodiment of a circuit 30 for controlling laser diode D. Control circuit 30 is a variation of the control circuit 20 described in relation with FIG. 2, where switch 22 is replaced with a P-type MOS transistor 32.

In this case, switch 32 is controlled by a signal inverse to signal S, for example, the gate of switch 32 is coupled, preferably connected, to node C.

Various embodiments and variations have been described. It will be understood by those skilled in the art that certain features of these various embodiments and variations may be combined, and other variations will occur to those skilled in the art.

Finally, the practical implementation of the described embodiments and variations is within the abilities of those skilled in the art based on the functional indications given hereinabove.

Such alterations, modifications, and improvements are intended to be part of this disclosure, and are intended to be within the spirit and the scope of the present invention.

Accordingly, the foregoing description is by way of example only and is not intended to be limiting. The present invention is limited only as defined in the following claims and the equivalents thereto.

What is claimed is:

1. A circuit comprising:
    a laser diode; and
    a switched-capacitance charge pump coupled to control the laser diode, the switched-capacitance charge pump comprising:
        a capacitor comprising a first electrode coupled to the laser diode,
        a first switch coupled between the first electrode of the capacitor and a power supply terminal,
        a diode switch coupled to the laser diode, the first electrode being coupled to the diode switch through the laser diode, and
        an inverting circuit comprising an input terminal coupled to a control terminal of the first switch and an output terminal coupled to a second electrode of the capacitor and a control terminal of the diode switch.

2. The circuit of claim 1, wherein the charge pump is capable of emitting current pulses at a frequency in the range from 10 to 800 MHz.

3. The circuit of claim 1, wherein the charge pump comprises a capacitor having a capacitance in the range from 10 to 800 pF.

4. The circuit of claim 1, wherein the charge pump comprises a capacitor, the capacitor comprising a discharge path through the laser diode and the diode switch.

5. The circuit of claim 1, wherein the inverting circuit is controllable by a pulse train.

6. The circuit of claim 5, wherein pulses of the pulse train have a duty cycle in the range from 5 to 40%.

7. The circuit of claim 1, wherein the charge pump further comprises a second switch for balancing the charges of the laser diode.

8. The circuit of claim 7, wherein the second switch has a first terminal coupled to a cathode of the laser diode and a second terminal coupled to a power supply terminal.

9. The circuit of claim 7, wherein the first switch and the inverting circuit are controllable by a pulse train and wherein the second switch is an N-type MOS transistor controllable by the pulse train.

10. The circuit of claim 7, wherein the first switch and the inverting circuit are controllable by a pulse train and wherein the second switch is a P-channel MOS transistor controllable by an inverse of the pulse train.

11. A circuit for controlling a laser diode, the circuit comprising:
a capacitor with a first electrode configured to be coupled to the laser diode and a second electrode configured to be coupled to control a diode switch that is coupled between the laser diode and a voltage node, the capacitor being configured to discharge by a flow of charge from the first electrode through the laser diode;
a switch coupled between the first electrode of the capacitor and a power supply terminal; and
an inverter comprising an output terminal coupled to the second electrode of the capacitor.

12. The circuit of claim 11, wherein the capacitor has a capacitance in the range from 10 to 800 pF.

13. The circuit of claim 11, wherein the switch and the inverter are configured to receive a pulse train.

14. The circuit of claim 13, wherein pulses of the pulse train have a duty cycle in the range from 5 to 40%.

15. A circuit comprising:
a laser diode having first and second terminals;
a first switch having a current path coupled between the second terminal of the laser diode and a reference voltage node;
a capacitor with a first electrode coupled to the first terminal of the laser diode and a second electrode coupled to a control terminal of the first switch, the capacitor having a discharge path through the laser diode and the first switch;
a second switch coupled between the first electrode of the capacitor and a power supply terminal;
an inverter comprising an output terminal coupled to the second electrode of the capacitor; and
a level shifter having an input coupled to the input of the inverter and an output coupled to a control terminal of the second switch.

16. The circuit of claim 15, further comprising a third switch having current path coupled between the power supply terminal and the second terminal of the laser diode.

17. The circuit of claim 15, wherein the first switch is configured to receive current pulses at a frequency in the range from 10 to 800 MHz from the inverter.

18. The circuit of claim 15, wherein the capacitor has a capacitance in the range from 10 to 800 pF.

* * * * *